US012656421B2

(12) United States Patent
Zhong et al.

(10) Patent No.: US 12,656,421 B2
(45) Date of Patent: Jun. 16, 2026

(54) CURRENT DETECTION APPARATUS AND ELECTRONIC DEVICE

(71) Applicant: Huawei Digital Power Technologies Co., Ltd., Shenzhen (CN)

(72) Inventors: Shu Zhong, Dongguan (CN); Xiaolu Hu, Shenzhen (CN); Xiaming Jing, Dongguan (CN); Liqiong Yi, Shenzhen (CN); Xiaoqing Hu, Dongguan (CN); Tao Xie, Shenzhen (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 152 days.

(21) Appl. No.: 18/436,724

(22) Filed: Feb. 8, 2024

(65) Prior Publication Data

US 2024/0175948 A1 May 30, 2024

Related U.S. Application Data

(63) Continuation of application No. PCT/CN2022/090477, filed on Apr. 29, 2022.

(30) Foreign Application Priority Data

Aug. 18, 2021 (CN) .......................... 202110949893.4

(51) Int. Cl.
 *G01R 33/09* (2006.01)
 *G01R 19/00* (2006.01)
 *H02M 1/00* (2006.01)
(52) U.S. Cl.
 CPC ....... *G01R 33/091* (2013.01); *G01R 19/0092* (2013.01); *H02M 1/0009* (2021.05)

(58) Field of Classification Search
 CPC .............. G01R 33/091; G01R 19/0092; G01R 15/207; G01R 15/205; H02M 1/0009
 See application file for complete search history.

(56) References Cited

U.S. PATENT DOCUMENTS 6,411,078 B1 * 6/2002 Nakagawa ........... G01R 15/183
 324/117 H
2008/0186021 A1 * 8/2008 Hashio ................. G01R 15/207
 264/254

(Continued)

FOREIGN PATENT DOCUMENTS

CN 107710001 A 2/2018
CN 113791263 A 12/2021

(Continued)

OTHER PUBLICATIONS

WU Jian-ping et al: "Instrument design for monitoring electromagnetic field based on AVR MCU", China Measurement and TEST vol. 37 No. 1, Jan. 2011, total 16 pages.

*Primary Examiner* — Dominic E Hawkins
(74) *Attorney, Agent, or Firm* — Conley Rose, P.C.

(57) ABSTRACT

A current detection apparatus includes a magnetic sensor, configured to sense a magnetic field change of a to-be-tested current path, and convert the magnetic field change into an electrical signal; and a magnetically conductive unit, including a magnetically conductive material. The magnetically conductive unit is disposed on at least one of the following positions: a left side of the magnetic sensor, a right side of the magnetic sensor, and an upper side of the magnetic sensor, and the left side and the right side of the magnetic sensor are a left side and a right side of the magnetic sensor along the to-be-tested current path.

20 Claims, 7 Drawing Sheets

MR element

To-be-tested current path

Magnetic sensor 100

Magnetic field strength

(56) References Cited

U.S. PATENT DOCUMENTS

| 2014/0111196 A1 | 4/2014 | Sakai et al. | |
| 2018/0275172 A1* | 9/2018 | Erdmann | G01R 19/0092 |
| 2019/0212371 A1 | 7/2019 | Racz et al. | |
| 2019/0219643 A1* | 7/2019 | Cadugan | G01R 33/0094 |
| 2021/0289619 A1* | 9/2021 | Kato | H02K 11/33 |
| 2022/0065956 A1* | 3/2022 | Takano | G01R 33/093 |
| 2022/0199317 A1* | 6/2022 | Kawamura | H02M 1/0064 |

FOREIGN PATENT DOCUMENTS

| JP | 2004170091 A | 6/2004 |
| JP | 2010002277 A | 1/2010 |
| KR | 20170124406 A | 11/2017 |
| WO | 2020241367 A1 | 12/2020 |

* cited by examiner

MR element

To-be-tested current path

Magnetic sensor 100

Magnetic field strength

Current detection apparatus 300

Magnetically conductive unit 200

| Magnetically conductive unit 200 | Magnetic sensor 100 | Magnetically conductive unit 200 |

To-be-tested current path

300

Three-dimensional diagram          Front view

300

Three-dimensional diagram          Front view

300

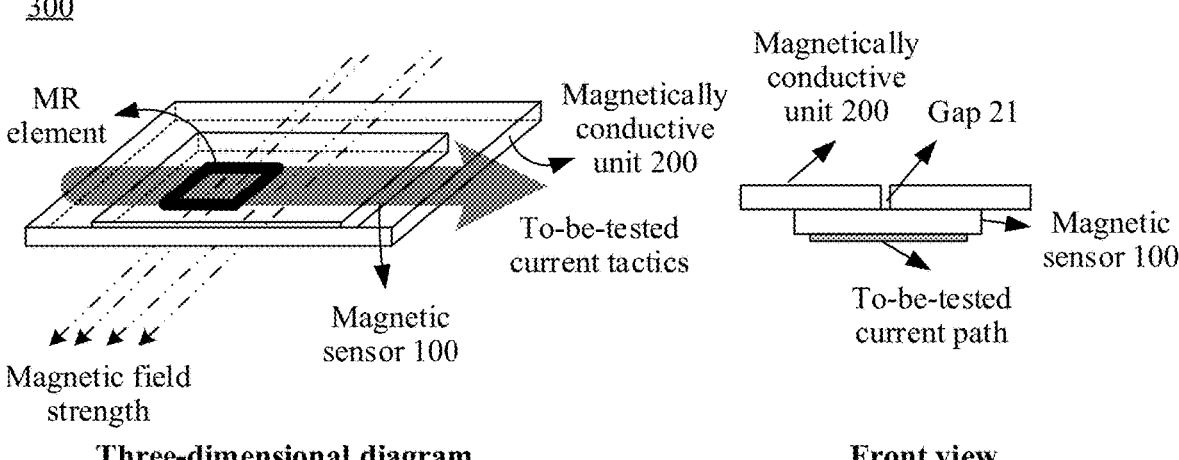

MR element

Magnetic field strength

Magnetic sensor 100

Magnetically conductive unit 200

To-be-tested current tactics

Three-dimensional diagram

Magnetically conductive unit 200    Gap 21

Magnetic sensor 100

To-be-tested current path

Front view

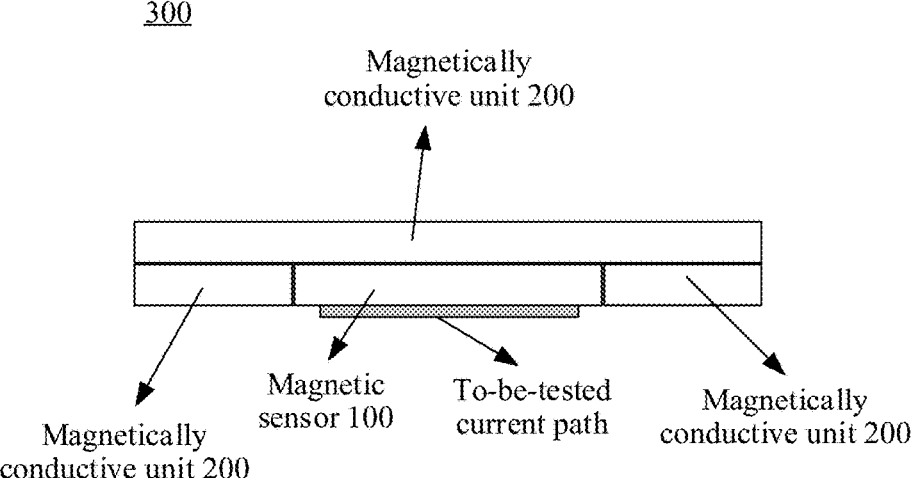

Magnetically conductive unit 200

Magnetically conductive unit 200

Magnetic sensor 100

To-be-tested current path

Magnetically conductive unit 200

Magnetically conductive unit 200

Magnetic sensor 100        To-be-tested current path

300

Magnetically
conductive unit 200    Gap 21

Magnetic sensor 100      To-be-tested current path

200
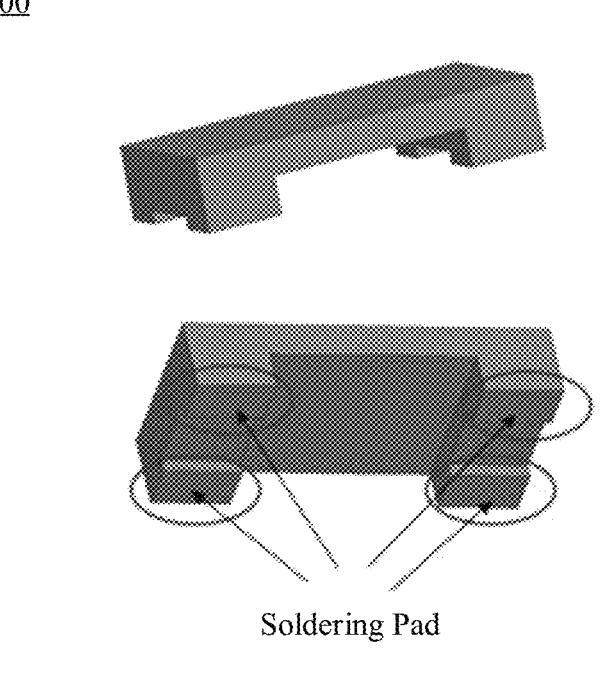
Soldering Pad
FIG. 9
200
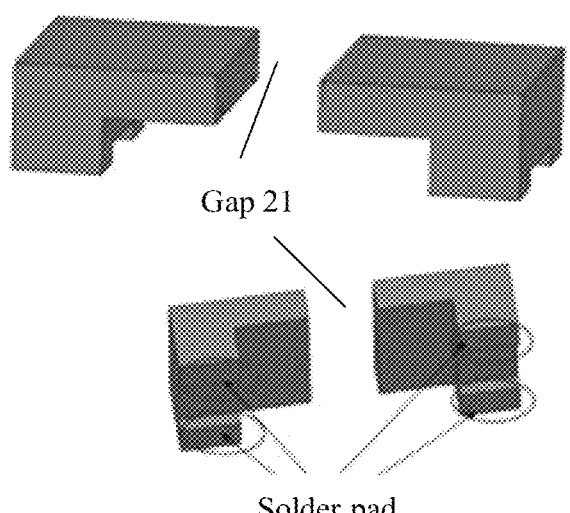
Gap 21
Solder pad
FIG. 10

300

Magnetically conductive unit 200 (housing 400)

Magnetic sensor 100

To-be-tested current path

300

Magnetically conductive unit 200 (housing 400)

Magnetic sensor 100

To-be-tested current path

300

Housing 400    Magnetically conductive unit 200

Magnetic sensor 100

To-be-tested current path

DC-AC conversion device

AC-DC conversion device

Current sampling apparatus 300

DC-DC conversion device

Current sampling apparatus 300

CURRENT DETECTION APPARATUS AND ELECTRONIC DEVICE

CROSS-REFERENCE TO RELATED APPLICATION

This is a continuation of International Patent Application No. PCT/CN2022/090477 filed on Apr. 29, 2022, which claims priority to Chinese Patent Application No. 202110949893.4 filed on Aug. 18, 2021. The disclosures of the aforementioned applications are hereby incorporated by reference in their entireties.

TECHNICAL FIELD

This application relates to the electrical field, and in particular, to a current detection apparatus and an electronic device.

BACKGROUND

Current detection is widely applied to the electrical field. Functions of current detection include collecting a switching transistor current, an inductor current, a capacitive current, and the like, to control and protect a circuit. A common current detection apparatus includes a magnetic sensor, configured to: sense a magnetic field change around a current path, and convert the magnetic field change into an electrical signal according to a specific rule.

In an application, a surface-mounted magnetic sensor chip may be disposed above a to-be-tested current path, to perform current detection. The solution of the surface-mounted magnetic sensor has advantages of high sensitivity and high precision, and can implement extremely high current detection bandwidth. However, the surface-mounted magnetic sensor detects a current by detecting an open magnetic field above the current path, and the open magnetic field is susceptible to factors such as a current, magnetic field distribution, and a magnetically conductive mechanical part of a surrounding component, and therefore a detection result of the magnetic sensor is interfered with.

SUMMARY

This application provides a current detection apparatus and an electronic device, to improve sensitivity of the current detection apparatus.

According to a first aspect, a current detection apparatus is provided. The current detection apparatus includes a magnetic sensor configured to sense a magnetic field change of a to-be-tested current path, and convert the magnetic field change into an electrical signal; and a magnetically conductive unit including a magnetically conductive material. The magnetically conductive unit is disposed on at least one of the following: a left side of the magnetic sensor, a right side of the magnetic sensor, and an upper side of the magnetic sensor, and the left side and the right side of the magnetic sensor are a left side and a right side of the magnetic sensor along the to-be-tested current path.

The magnetically conductive unit is disposed on a periphery of the magnetic sensor, to form a magnetically conductive path. Because strength of a magnetic field in the magnetically conductive path is greater than strength of a magnetic field outside the magnetically conductive path, the magnetic field is insensitive to a magnetic field change caused by an external component, current, and mechanically conductive mechanical part, so that external interference caused to the magnetic field of the magnetic sensor is reduced, thereby improving sensitivity of the current detection apparatus.

With reference to the first aspect, in some possible implementations, the magnetically conductive unit is disposed in compliance with any one of the following: the magnetically conductive unit is disposed on the left side and the right side of the magnetic sensor; the magnetically conductive unit is disposed on the upper side of the magnetic sensor; and the magnetically conductive unit is disposed on the left side, the right side, and the upper side of the magnetic sensor.

With reference to the first aspect, in some possible implementations, the magnetic sensor includes at least one of the following: a tunnel magnetoresistance (TMR) magnetic sensor, a giant magnetoresistance (GMR) magnetic sensor, and an anisotropic magnetoresistance (AMR) magnetic sensor.

With reference to the first aspect, in some possible implementations, the magnetically conductive unit is integrally formed.

With reference to the first aspect, in some possible implementations, the magnetically conductive unit has a U-shaped cross section.

With reference to the first aspect, in some possible implementations, a gap is disposed in a part that is of the magnetically conductive unit and that is disposed above the magnetic sensor.

It can be learned from the magnetic flux continuity theorem that strength of a magnetic field at the gap is far greater than strength of a magnetic field of a magnetically conductive material, so that strength of a magnetic field of a to-be-tested current at the magnetic sensor is sufficiently large, thereby improving current detection sensitivity and a capability of resisting interference from an external magnetic field.

With reference to the first aspect, in some possible implementations, the gap meets any one of the following conditions: the gap is filled with a non-magnetically conductive material; the gap is filled with another magnetically conductive material, and a magnetic conductivity of the another magnetically conductive material is different from a magnetic conductivity of the magnetically conductive unit; and the gap is not filled with a material.

With reference to the first aspect, in some possible implementations, the magnetic sensor includes a magnetoresistance (MR) element, and the gap is disposed above the MR element.

The gap may be disposed above the MR element in the magnetic sensor, so that a shielding material (namely, the magnetically conductive unit) affects strength of a magnetic field at the MR element as little as possible, thereby ensuring accuracy of current detection of the magnetic sensor.

With reference to the first aspect, in some possible implementations, the magnetically conductive unit constitutes at least a part of a housing of the magnetic sensor.

The magnetically conductive unit may also serve as at least a part of the housing of the magnetic sensor, so that accuracy of current detection is improved, and occupation space of the current detection apparatus is also reduced.

With reference to the first aspect, in some possible implementations, the housing of the magnetic sensor is disposed outside the magnetically conductive unit, and the housing of the magnetic sensor is a non-magnetically conductive material.

With reference to the first aspect, in some possible implementations, the magnetically conductive unit includes at least one of the following magnetically conductive materials: a ferrite magnetically conductive material, an amorphous magnetically conductive material, and a nanocrystal-line magnetically conductive material.

According to a second aspect, a direct current-alternating current (DC-AC) conversion device is provided. The direct current-alternating current conversion device includes: a DC-AC conversion circuit, configured to implement conversion from a direct current to an alternating current; and the current detection apparatus according to any one of the first aspect and the possible implementations of the first aspect. The current detection apparatus is configured to perform current detection on a current path in the DC-AC conversion circuit.

According to a third aspect, an alternating current-direct current (AC-DC) conversion device is provided. The alternating current-direct current conversion device includes: an AC-DC conversion circuit, configured to implement conversion from an alternating current to a direct current; and the current detection apparatus according to any one of the first aspect and the possible implementations of the first aspect. The current detection apparatus is configured to perform current detection on a current path in the AC-DC conversion circuit.

According to a fourth aspect, a direct current-direct current (DC-DC) conversion device is provided. The direct current-direct current conversion device includes: a DC-DC conversion circuit, configured to implement conversion between direct current voltages; and the current detection apparatus according to any one of the first aspect and the possible implementations of the first aspect. The current detection apparatus is configured to perform current detection on a current path in the DC-DC conversion circuit.

According to a fifth aspect, an electronic device is provided. The electronic device includes the current detection apparatus according to any one of the first aspect and the possible implementations of the first aspect.

BRIEF DESCRIPTION OF DRAWINGS

FIG. 5 is a schematic diagram of a current detection apparatus 300 according to an embodiment of this application;

FIG. 6 to FIG. 8 are schematic diagrams of a current detection apparatus 300 according to another embodiment of this application;

FIG. 9 is a schematic diagram of a structure of a magnetically conductive unit 200 according to another embodiment of this application;

FIG. 10 is a schematic diagram of a structure of a magnetically conductive unit 200 according to another embodiment of this application;

DESCRIPTION OF EMBODIMENTS

The following describes technical solutions of this application with reference to the accompanying drawings.

For ease of understanding, some terms in embodiments of this application are first described.

A current sensor can convert, according to a specific rule, current information of a to-be-tested object into an electrical signal or information of another required form that complies with a specific standard, and output the electrical signal or the information of the another required form. The current sensor is usually a magnetic sensor. The sensor senses a change in a physical quantity related to a magnetic phenomenon, and converts the change into an electrical signal for detection. Common magnetic sensors include a semiconductor Hall device, an AMR magnetic sensor, a GMR magnetic sensor, and a TMR magnetic sensor.

The AMR magnetic sensor is a current sensor based on an anisotropic magnetoresistance effect. The anisotropic magnetoresistance effect refers to a phenomenon in which a resistivity of a ferromagnetic material changes with an included angle between a magnetization direction and a current direction of the ferromagnetic material.

The GMR magnetic sensor is a current sensor based on a GMR effect. The GMR effect refers to a phenomenon in which a resistivity of a magnetic material under the action of an external magnetic field greatly differs from that when there is no external magnetic field.

The TMR magnetic sensor is a current sensor based on a tunnel magnetoresistance effect.

An MR element is an element with a magnetoresistance effect. The magnetoresistance effect is an effect that a resistance of a material changes with an external magnetic field. Common elements with the magnetoresistance effect include an AMR element, a GMR element, and a TMR element.

A to-be-tested current path is a flow path of a to-be-tested current, and is located below a current sensor. For example, the to-be-tested current path may be a switching transistor current, an inductor current, an input current, an output current, or the like of a power electronic device or a power supply.

Figure 1:
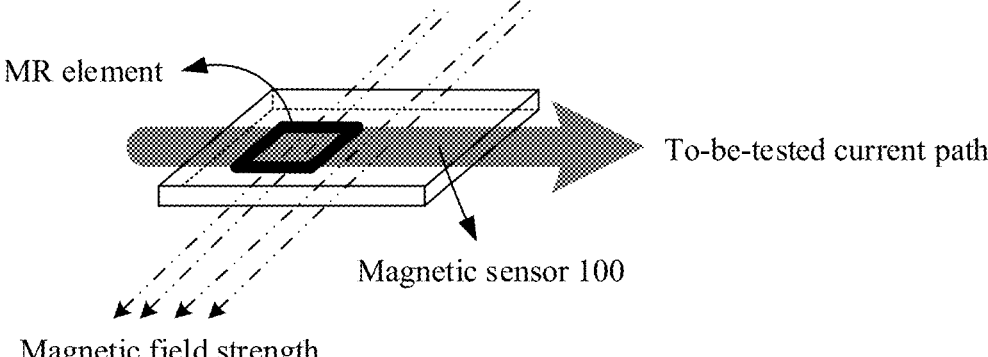
FIG. 1 is a schematic diagram of an application scenario according to an embodiment of this application.

FIG. 1 is a schematic diagram of an application scenario according to an embodiment of this application. As shown in FIG. 1, a magnetic sensor 100 is surface-mounted above a to-be-tested current path. The magnetic sensor 100 detects a value of a to-be-tested current by detecting horizontal magnetic field strength at an internal MR element. A magnetic field in which the MR element in the magnetic sensor 100 is located is an open magnetic field, and is susceptible to factors such as a magnetic field of a current, magnetic leakage of a magnetic component, and a magnetically conductive mechanical part, causing a deviation between a measurement result and an expected value.

To resolve the foregoing problem, embodiments of this application provide a current detection apparatus 300, to improve an anti-interference capability of a surface-mounted magnetic sensor.

In solutions provided in embodiments of this application, a magnetically conductive path may be created on a periphery of the magnetic sensor, and the magnetically conductive path includes a magnetically conductive unit. Because strength of a magnetic field in the magnetically conductive path is greater than strength of an external magnetic field, the magnetic field is insensitive to a magnetic field change caused by an external component, current, and mechanical part, so that a magnetic field at an MR element is not interfered with by the outside.

Figure 2:
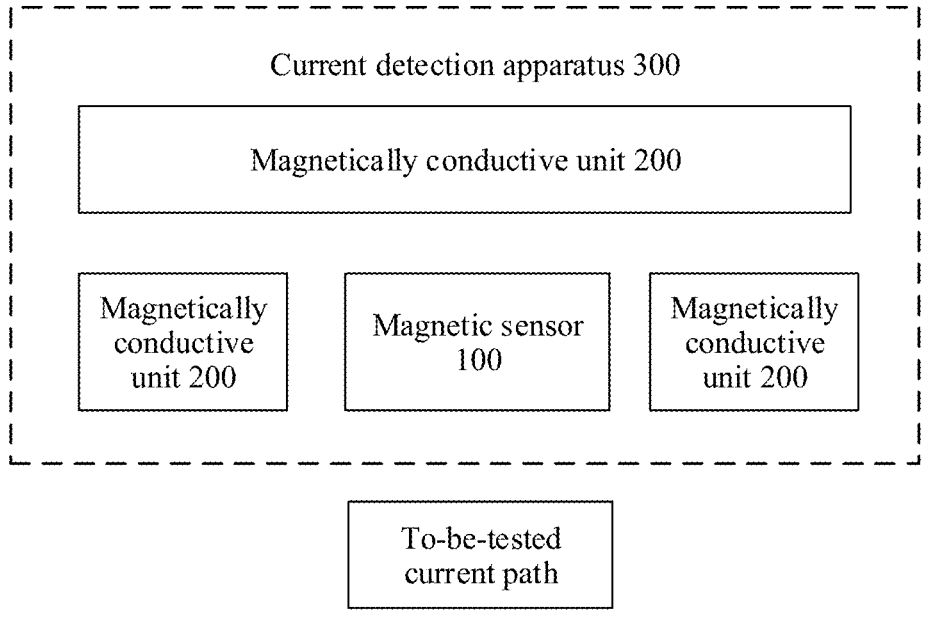
FIG. 2 is a schematic diagram of a current detection apparatus 300 according to an embodiment of this application.

FIG. 2 is a schematic diagram of a current detection apparatus 300 according to an embodiment of this application. As shown in FIG. 2, the current detection apparatus 300 includes a magnetic sensor 100 and a magnetically conductive unit 200. For example, the magnetic sensor 100 is configured to be surface-mounted above a to-be-tested current path. It may be understood that the magnetic sensor 100 is a surface-mounted chip.

The magnetic sensor 100 is configured to: sense a magnetic field change of the to-be-tested current path, and convert the magnetic field change into an electrical signal.

The magnetically conductive unit 200 includes a magnetically conductive material, and the magnetically conductive unit 200 is disposed on at least one of the following positions: a left side of the magnetic sensor 100, a right side of the magnetic sensor 100, and an upper side of the magnetic sensor 100. The left side and the right side of the magnetic sensor 100 are a left side and a right side of the magnetic sensor 100 along the to-be-tested current path.

Optionally, the magnetic sensor 100, the magnetically conductive unit 200, and the to-be-tested current path may be disposed on a circuit board, and the to-be-tested current path may include a circuit to which a direct current or an alternating current is applied. The alternating current may be a low-frequency, an intermediate-frequency, or a high-frequency alternating current. For example, the to-be-tested current path may be a current path in a switching power supply circuit, for example, a switching transistor current, an inductor current, or a capacitive current.

In some examples, the to-be-tested current path includes but is not limited to the current path in the switching power supply circuit.

A front side of the magnetic sensor 100 may refer to a current outflow direction in the current path, and a rear side of the magnetic sensor 100 may refer to a current inflow direction in the current path. The left side and the right side of the magnetic sensor 100 may be respectively a left side and a right side along the current outflow direction in the current path.

A lower side of the magnetic sensor 100 is adjacent to the to-be-tested current path, and the upper side of the magnetic sensor 100 deviates from the to-be-tested current path.

In some examples, the magnetically conductive unit 200 is disposed on the left side and the right side of the magnetic sensor 100. In other examples, the magnetically conductive unit 200 is disposed on the upper side of the magnetic sensor 100. Alternatively, in some examples, the magnetically conductive unit 200 may be disposed on the upper side, the left side, and the right side of the magnetic sensor 100. In some examples in this case, the magnetically conductive unit 200 has a U-shaped cross section, and may also be referred to as a U-shaped magnetically conductive unit or a U-shaped shielding can.

In this embodiment of this application, the magnetically conductive unit is disposed on a periphery of the magnetic sensor, to form a magnetically conductive path. Because strength of a magnetic field in the magnetically conductive path is greater than strength of a magnetic field outside the magnetically conductive path, the magnetic field is insensitive to a magnetic field change caused by an external component, current, and mechanical part, so that a magnetic field at an MR element is not interfered with by the outside.

Optionally, the magnetically conductive unit 200 may include but is not limited to the following magnetically conductive materials: a ferrite magnetically conductive material, an amorphous magnetically conductive material, and a nanocrystalline magnetically conductive material.

In some examples, the magnetically conductive unit 200 may include a single magnetically conductive material, or may include a plurality of magnetically conductive materials with different magnetic conductivities.

Optionally, the magnetically conductive unit 200 may be fastened to the circuit board through bonding, electroplating, welding, or the like.

Optionally, a gap may be disposed in at least a part that is of the magnetically conductive unit 200 and that is disposed on the upper side of the magnetic sensor 100. It can be learned from the magnetic flux continuity theorem that strength of a magnetic field at the gap is far greater than strength of a magnetic field of a magnetically conductive material, so that strength of a magnetic field of a to-be-tested current at the magnetic sensor is sufficiently large, thereby improving current detection sensitivity and a capability of resisting interference from an external magnetic field.

In this embodiment of this application, the gap is added to the part that is of the magnetically conductive unit 200 and that is located above the magnetic sensor 100, so that it is ensured that the strength of the magnetic field of the to-be-tested current at the magnetic sensor is sufficiently large, thereby improving current detection sensitivity.

Optionally, the gap may be filled with a non-magnetically conductive material or another magnetically conductive material, where a magnetic conductivity of the another magnetically conductive material is different from a magnetic conductivity of the magnetically conductive unit, or may not be filled with any material. When the gap is not filled with a material, the gap may also be referred to as an air gap. As an example instead of a limitation, the non-magnetically conductive material may be epoxy resin. For example, the another magnetically conductive material may include a magnetic powder adhesive material or an iron-silicon-aluminum magnetically conductive material.

In some examples, the gap may be disposed above an MR element in the magnetic sensor 100, so that a shielding material (namely, the magnetically conductive unit 200) affects strength of a magnetic field at the MR element as little as possible, thereby ensuring accuracy of current detection of the magnetic sensor 100.

Figure 3:
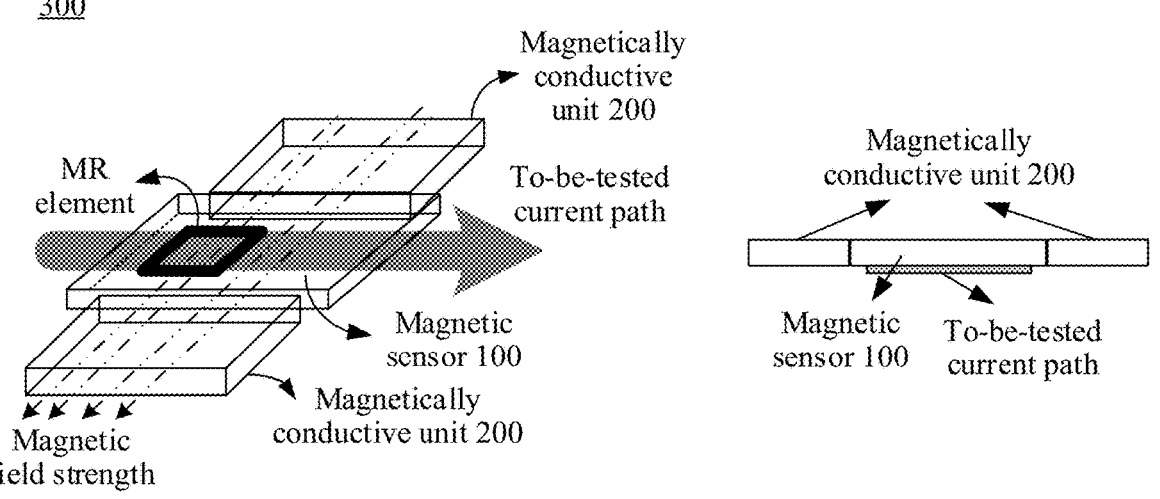
FIG. 3 is a schematic diagram of a current detection apparatus 300 according to an embodiment of this application.

FIG. 3 is a schematic diagram of a current detection apparatus 300 according to an embodiment of this application. As shown in FIG. 3, a magnetic sensor 100 is disposed above a to-be-tested current path, and a magnetically conductive unit 200 is disposed on a left side and a right side of the magnetic sensor 100. Because a resistance of a magnetic path of the magnetically conductive unit 200 is relatively small, and magnetic flux density is relatively large, the magnetically conductive unit 200 is not susceptible to impact of an external magnetic field, so that impact on an MR element that is caused by the external magnetic field can be reduced.

Figure 4:
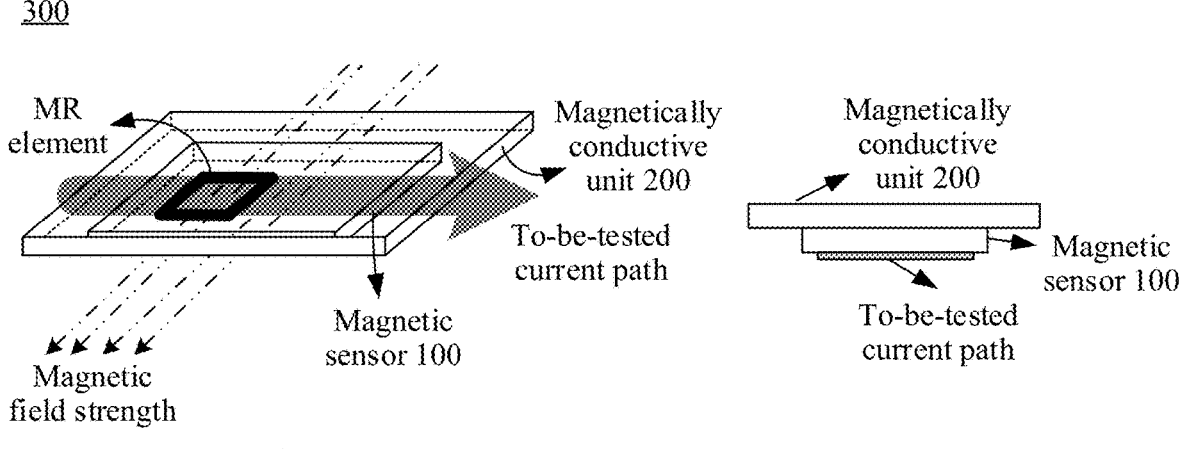
FIG. 4 is a schematic diagram of a current detection apparatus 300 according to an embodiment of this application.

FIG. 4 is a schematic diagram of a current detection apparatus 300 according to another embodiment of this application. As shown in FIG. 4, a magnetic sensor 100 is disposed above a to-be-tested current path, and a magnetically conductive unit 200 is disposed on an upper side of the magnetic sensor 100. Because a resistance of a magnetic path of the magnetically conductive unit 200 is relatively small, and magnetic flux density is relatively large, the magnetically conductive unit 200 is not susceptible to impact of an external magnetic field, so that impact on a magnetic field of an MR element that is caused by the external magnetic field is reduced.

FIG. 5 is a schematic diagram of a current detection apparatus 300 according to another embodiment of this application. As shown in FIG. 5, a magnetic sensor 100 is disposed above a to-be-tested current path, and a magnetically conductive unit 200 is disposed on an upper side of the magnetic sensor 100. In addition, one or more gaps 21 may be disposed on the magnetically conductive unit 200 in a direction of the to-be-tested current path. The one or more gaps 21 may be disposed above an MR element in the magnetic sensor 100, to ensure that strength of a magnetic field of a to-be-tested current at the MR element is sufficiently large, so that current detection sensitivity is improved.

Figure 7:
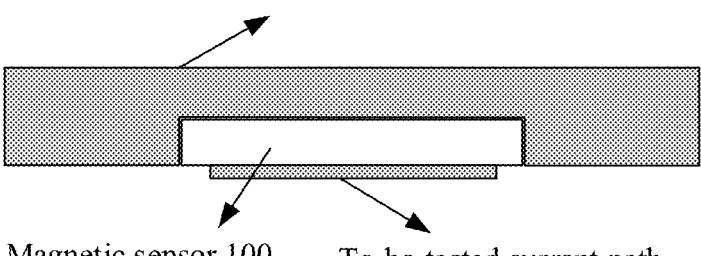
Figure 8:
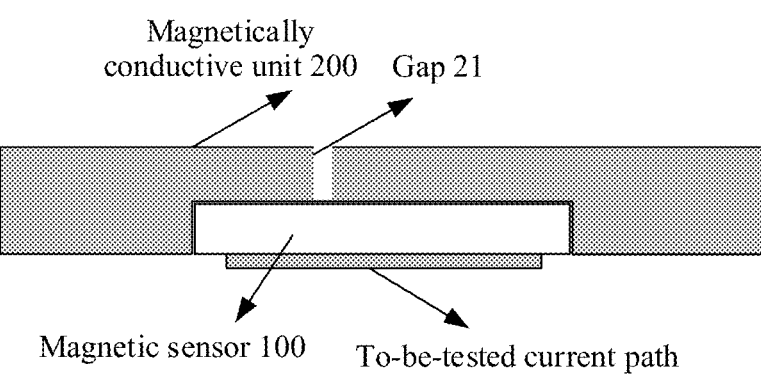

FIG. 6 to FIG. 8 are schematic diagrams of a current detection apparatus 300 according to another embodiment of this application. In FIG. 6 to FIG. 8, a magnetic sensor 300 is disposed above a to-be-tested current path, and a magnetically conductive unit 200 surrounds the magnetic sensor 100 on a left side, a right side, and an upper side of the magnetic sensor 100. Specifically, a magnetically conductive unit 200 in FIG. 6 may be formed by combining a plurality of magnetically conductive plates. A magnetically conductive unit 200 in FIG. 7 may be an integrally formed U-shaped magnetically conductive unit. One or more gaps 21 may be disposed on a magnetically conductive unit 200 in FIG. 8 in a direction of the to-be-tested current path.

Figure 11:
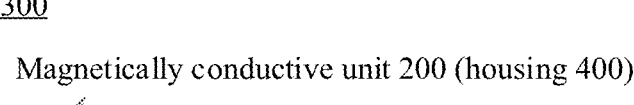
FIG. 11 and FIG. 12 are schematic diagrams of structures of a current detection apparatus 300 according to another embodiment of this application.
Figure 12:
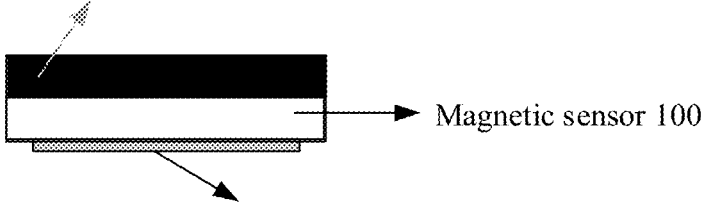
Figure 13:
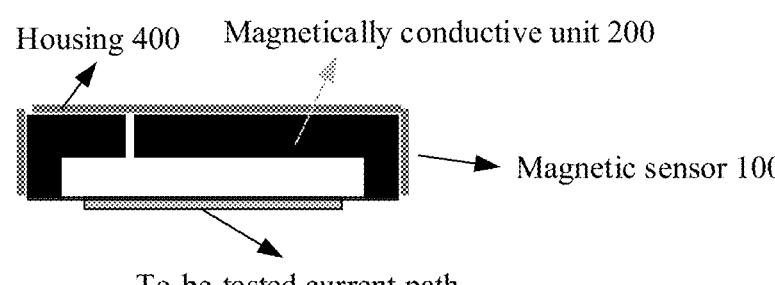
FIG. 13 is a schematic diagram of a structure of a current detection apparatus 300 according to another embodiment of this application.

Optionally, the magnetically conductive unit and the magnetic sensor may be packaged together, or only the magnetic sensor may be packaged, and then the magnetically conductive unit and the magnetic sensor are fastened to a circuit board. For example, FIG. 9 and FIG. 10 show examples in which only the magnetic sensor is packaged. FIG. 11 to FIG. 13 show examples in which the magnetically conductive unit and the magnetic sensor are jointly packaged.

FIG. 9 is a schematic diagram of a structure of a magnetically conductive unit 200 according to another embodiment of this application. As shown in FIG. 9, the magnetically conductive unit 200 is a U-shaped shielding can to cover a left side, a right side, and an upper side of a magnetic sensor (not shown in FIG. 9). The magnetically conductive unit 200 may include an integrally formed magnetically conductive material. In addition, a solder pad is further disposed at the bottom of the magnetically conductive unit 200, so that the magnetically conductive unit is pasted or welded to a circuit board by using the solder pad.

FIG. 10 is a schematic diagram of a structure of a magnetically conductive unit 200 according to another embodiment of this application. FIG. 10 differs from FIG. 9 in that a gap 21 is disposed on the top of the magnetically conductive unit 200. Therefore, the magnetically conductive unit 200 includes two parts of magnetically conductive materials, so that the gap is formed.

FIG. 11 and FIG. 12 are schematic diagrams of structures of a current detection apparatus 300 according to another embodiment of this application. In FIG. 11 and FIG. 12, a magnetically conductive unit 200 and a housing 400 of a magnetic sensor 100 are designed as a whole. In other words, the magnetically conductive unit 200 also has all or some functions of the housing of the magnetic sensor 100. For example, in FIG. 11, the magnetically conductive unit

200 serves as an upper housing 400 of the magnetic sensor 100. On other sides of the magnetic sensor 100, a non-magnetically conductive material may also be used as a housing 400 of the magnetic sensor 100. For another example, in FIG. 12, the magnetically conductive unit 200 may serve as a housing 400 on an upper side, a left side, and a right side of the magnetic sensor 100, and a non-magnetically conductive material may be used as a housing on another side.

FIG. 13 is a schematic diagram of a structure of a current detection apparatus 300 according to another embodiment of this application. In FIG. 13, a magnetically conductive unit 200 and a housing are packaged in different materials, and the housing externally wraps the magnetically conductive unit 200. The magnetically conductive unit uses a magnetically conductive material, and the housing may use a non-magnetically conductive material such as epoxy resin. The magnetically conductive material in FIG. 13 is in the form of a U-shaped shielding can, and a gap is disposed on the top of the U-shaped shielding can. The housing is further packaged on a periphery of the magnetically conductive unit.

The current detection apparatus in this embodiment of this application may be widely applied to any scenario in which current detection is to be performed. For example, the current detection apparatus may be applied to a power electronic device or a power supply. The power supply may include, for example, a DC-AC conversion device, an AC-DC conversion device, or a DC-DC conversion device. The following describes several specific application scenarios of the current detection apparatus with reference to the accompanying drawings.

Figure 14:
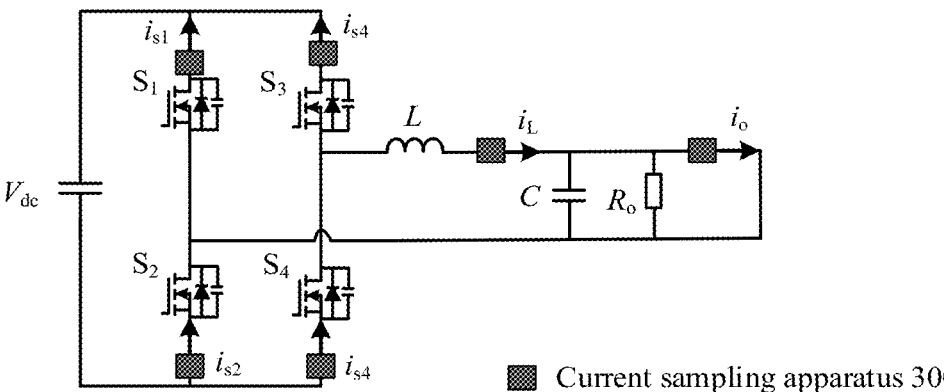
FIG. 14 is a schematic diagram of a DC-AC conversion device according to an embodiment of this application.

FIG. 14 is a schematic diagram of a DC-AC conversion device according to an embodiment of this application. As shown in FIG. 14, the DC-AC conversion device includes a DC-AC conversion circuit and one or more current detection apparatuses 300. The DC-AC conversion circuit is configured to implement conversion from a direct current to an alternating current. A specific topology of the DC-AC conversion circuit is not limited in this embodiment of this application, provided that the DC-AC conversion circuit can implement a function of conversion from a direct current to an alternating current. The one or more current detection apparatuses 300 may be configured to perform current detection on a current path in the DC-AC conversion circuit.

As shown in FIG. 14, the one or more current detection apparatuses 300 may be respectively configured to detect one or more current paths in the DC-AC conversion circuit. For example, the current detection apparatus 300 may be surface-mounted above the to-be-tested current path. For example, a switching transistor current in the DC-AC conversion circuit may be detected, or an inductor current, an input/output current, or the like in the DC-AC conversion circuit may be detected.

As shown in FIG. 14, the switching transistor current includes currents $i_{s1}$ to $i_{s4}$ respectively flowing through a switching transistor S1 to a switching transistor S4. The inductor current includes a current $i_L$ flowing through an inductor L. The output current includes an output current $i_o$.

Figure 15:
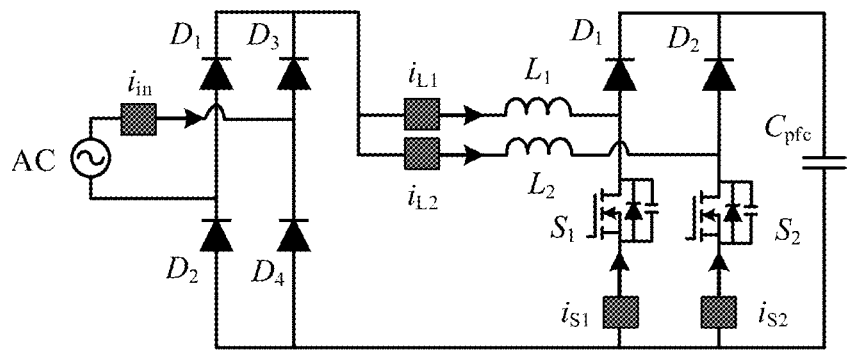
FIG. 15 is a schematic diagram of an AC-DC conversion device according to an embodiment of this application.

FIG. 15 is a schematic diagram of an AC-DC conversion device according to an embodiment of this application. As shown in FIG. 15, the AC-DC conversion device includes an AC-DC conversion circuit and one or more current detection apparatuses 300. The AC-DC conversion circuit is configured to implement conversion from an alternating current to a direct current. A specific topology of the AC-DC conversion circuit is not limited in this embodiment of this application, provided that the AC-DC conversion circuit can implement a function of conversion from an alternating current to a direct current. The one or more current detection apparatuses 300 may be configured to perform current detection on a current path in the AC-DC conversion circuit.

As shown in FIG. 15, the one or more current detection apparatuses 300 may be respectively configured to detect one or more current paths in the AC-DC conversion circuit. For example, the current detection apparatus 300 may be surface-mounted above the to-be-tested current path. For example, a switching transistor current in the AC-DC conversion circuit may be detected, or an inductor current, an input/output current, or the like in the AC-DC conversion circuit may be detected.

As shown in FIG. 15, the switching transistor current includes currents $i_{s1}$ and $i_{s2}$ respectively flowing through a switching transistor S1 and a switching transistor S2. The inductor current includes currents $i_{L1}$ and $i_{L2}$ flowing through inductors $L_1$ and $L_2$. The input current includes an input current $i_{in}$.

Figure 16:
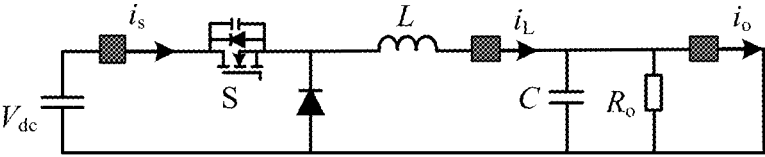
FIG. 16 is a schematic diagram of a DC-DC conversion device according to an embodiment of this application.

FIG. 16 is a schematic diagram of a DC-DC conversion device according to an embodiment of this application. As shown in FIG. 16, the DC-DC conversion device includes a DC-DC conversion circuit and one or more current detection apparatuses 300. The DC-DC conversion circuit is configured to implement conversion between direct current voltages. A specific topology of the DC-DC conversion circuit is not limited in this embodiment of this application, provided that the DC-DC conversion circuit can implement a function of conversion between direct current voltages. The one or more current detection apparatuses 300 may be configured to perform current detection on a current path in the DC-DC conversion circuit.

As shown in FIG. 16, the one or more current detection apparatuses 300 may be respectively configured to detect one or more current paths in the DC-DC conversion circuit. For example, the current detection apparatus 300 may be surface-mounted above the to-be-tested current path. For example, a switching transistor current in the DC-DC conversion circuit may be detected, or an inductor current, an input/output current, or the like in the DC-DC conversion circuit may be detected.

As shown in FIG. 16, the switching transistor current includes a current is flowing through a switching transistor S. The inductor current includes a current $i_L$ flowing through an inductor L. The output current includes an output current $i_o$.

A person of ordinary skill in the art may be aware that, in combination with the examples described in embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, refer to a corresponding process in the foregoing method embodiments. Details are not described herein again.

In the several embodiments provided in this application, it should be understood that the disclosed system, apparatus, and method may be implemented in other manners. For example, the described apparatus embodiment is merely an example. For example, division into the units is merely logical function division and may be other division during actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in an electrical form, a mechanical form, or another form.

The units described as separate parts may or may not be physically separate, and parts displayed as units may or may not be physical units, may be located in one location, or may be distributed on a plurality of network units. Some or all of the units may be selected based on actual requirements to achieve the objective of the solutions of embodiments.

In addition, functional units in embodiments of this application may be integrated into one processing unit, each of the units may exist alone physically, or two or more units may be integrated into one unit.

When the functions are implemented in a form of a software function unit and sold or used as an independent product, the functions may be stored in a computer-readable storage medium. Based on such an understanding, the technical solutions of this application essentially, or the part contributing to the conventional technology, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of this application. The foregoing storage medium includes various media that can store program code, such as a Universal Serial Bus (USB) flash drive, a removable hard disk, a read-only memory (ROM), a random-access memory (RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A current detection apparatus, comprising:
a magnetic sensor located in a first plane, comprising a magnetoresistance (MR) element defining a hole in a middle of the MR element, and configured to:
sense a magnetic field change of a to-be-tested current path; and
convert the magnetic field change into an electrical signal; and
a magnetic conductor comprising:
a first magnetically conductive material; and
at least one of the following:
a left portion disposed on a left side of the magnetic sensor along the to-be-tested current path, wherein the left portion is located in the first plane;
a right portion disposed on a right side of the magnetic sensor along the to-be-tested current path, wherein the right portion is located in the first plane; or

an upper portion disposed on an upper side of the magnetic sensor, wherein the upper portion is located in a second plane parallel to the first plane.

2. The current detection apparatus of claim 1, wherein the MR element comprises at least one of a tunnel magnetoresistance (TMR) magnetic sensor, a giant magnetoresistance (GMR) magnetic sensor, or an anisotropic magnetoresistance (AMR) magnetic sensor.

3. The current detection apparatus of claim 1, wherein the magnetic conductor is integrally formed.

4. The current detection apparatus of claim 1, wherein the magnetic conductor has a U-shaped cross section.

5. The current detection apparatus of claim 1, wherein the magnetic conductor comprises a gap that is disposed above the magnetic sensor.

6. The current detection apparatus of claim 5, wherein the gap meets any one of the following conditions:

the gap is filled with a non-magnetically conductive material;

the gap is filled with a second magnetically conductive material, wherein a second magnetic conductivity of the second magnetically conductive material is different from a first magnetic conductivity of the first magnetically conductive material; or the gap is not filled with a material.

7. The current detection apparatus of claim 6, wherein the gap is further disposed above the MR element.

8. The current detection apparatus of claim 1, wherein the magnetic sensor comprises a housing, and wherein the housing comprises the magnetic conductor.

9. The current detection apparatus of claim 1, wherein the magnetic sensor comprises a housing disposed outside the magnetic conductor, and wherein the housing is a non-magnetically conductive material.

10. The current detection apparatus of claim 1, wherein the first magnetically conductive material comprises at least one of a ferrite magnetically conductive material, an amorphous magnetically conductive material, or a nanocrystalline magnetically conductive material.

11. A direct current-alternating current (DC-AC) conversion device, comprising:

a DC-AC conversion circuit configured to implement conversion from a direct current to an alternating current; and a current detection apparatus configured to perform current detection on a to-be-tested current path in the DC-AC conversion circuit, wherein the current detection apparatus comprises:

a magnetic sensor located in a first plane, comprising a magnetoresistance (MR) element defining a hole in a middle of the MR element, and configured to:

sense a magnetic field change of the to-be-tested current path; and convert the magnetic field change into an electrical signal; and a magnetic conductor comprising:

a first magnetically conductive material; and at least one of the following:

a left portion disposed on a left side of the magnetic sensor along the to-be-tested current path, wherein the left portion is located in the first plane;

a right portion disposed on a right side of the magnetic sensor along the to-be-tested current path, wherein the right portion is located in the first plane; or

an upper portion disposed on an upper side of the magnetic sensor, wherein the upper portion is located in a second plane parallel to the first plane.

12. The DC-AC conversion device of claim 11, wherein the MR element comprises at least one of a tunnel magnetoresistance (TMR) magnetic sensor, a giant magnetoresistance (GMR) magnetic sensor, or an anisotropic magnetoresistance (AMR) magnetic sensor.

13. The DC-AC conversion device of claim 11, wherein the magnetic conductor comprises a gap that is disposed above the magnetic sensor.

14. The DC-AC conversion device of claim 13, wherein the gap meets any one of the following conditions:

the gap is filled with a non-magnetically conductive material;

the gap is filled with a second magnetically conductive material, wherein a second magnetic conductivity of the second magnetically conductive material is different from a first magnetic conductivity of the first magnetically conductive material; or the gap is not filled with a material.

15. An alternating current-direct current (AC-DC) conversion device, comprising:

an AC-DC conversion circuit configured to implement conversion from an alternating current to a direct current; and a current detection apparatus configured to perform current detection on a to-be-tested current path in the AC-DC conversion circuit, wherein the current detection apparatus comprises:

a magnetic sensor located in a first plane, comprising a magnetoresistance (MR) element defining a hole in a middle of the MR element, and configured to:

sense a magnetic field change of the to-be-tested current path; and convert the magnetic field change into an electrical signal; and a magnetic conductor comprising:

a first magnetically conductive material; and at least one of the following:

a left portion disposed on a left side of the magnetic sensor along the to-be-tested current path, wherein the left portion is located in the first plane;

a right portion disposed on a right side of the magnetic sensor along the to-be-tested current path, wherein the right portion is located in the first plane; or an upper portion disposed on an upper side of the magnetic sensor, wherein the upper portion is located in a second plane parallel to the first plane.

16. The AC-DC conversion device of claim 15, wherein the MR element comprises at least one of a tunnel magnetoresistance (TMR) magnetic sensor, a giant magnetoresistance (GMR) magnetic sensor, or an anisotropic magnetoresistance (AMR) magnetic sensor.

17. The AC-DC conversion device of claim 15, wherein the magnetic conductor comprises a gap that is disposed above the magnetic sensor.

18. The AC-DC conversion device of claim 17, wherein the gap meets any one of the following conditions:

the gap is filled with a non-magnetically conductive material;

the gap is filled with a second magnetically conductive material, wherein a second magnetic conductivity of the second magnetically conductive material is different from a first magnetic conductivity of the first magnetically conductive material; or the gap is not filled with a material.

19. A direct current-direct current (DC-DC) conversion device, comprising:

a DC-DC conversion circuit configured to implement conversion between direct current voltages; and a current detection apparatus configured to perform current detection on a to-be-tested current path in the DC-DC conversion circuit, wherein the current detection apparatus comprises:

a magnetic sensor located in a first plane, comprising a magnetoresistance (MR) element defining a hole in a middle of the MR element, and configured to:

sense a magnetic field change of the to-be-tested current path; and convert the magnetic field change into an electrical signal; and a magnetic conductor comprising:

a magnetically conductive material; and at least one of the following:

a left portion disposed on a left side of the magnetic sensor along the to-be-tested current path, wherein the left portion is located in the first plane;

a right portion disposed on a right side of the magnetic sensor along the to-be-tested current path, wherein the right portion is located in the first plane; or an upper portion disposed on an upper side of the magnetic sensor, wherein the upper portion is located in a second plane parallel to the first plane.

20. The DC-DC conversion device of claim 19, wherein the MR element comprises at least one of a tunnel magnetoresistance (TMR) magnetic sensor, a giant magnetoresistance (GMR) magnetic sensor, or an anisotropic magnetoresistance (AMR) magnetic sensor.

* * * * *